United States Patent [19]

Muramatsu et al.

[11] Patent Number: 4,945,518

[45] Date of Patent: Jul. 31, 1990

[54] LINE MEMORY FOR SPEED CONVERSION

[75] Inventors: Kunio Muramatsu, Fujisawa; Seigo Suzuki, Tokyo, both of Japan

[73] Assignee: Kabushiki Kaisha Toshiba, Kawasaki, Japan

[21] Appl. No.: 363,276

[22] Filed: Jun. 8, 1989

[30] Foreign Application Priority Data

Jun. 9, 1988 [JP] Japan .................. 63-141979

[51] Int. Cl.⁵ .............................................. G11C 7/00
[52] U.S. Cl. ...................................... 365/233; 365/219; 365/221; 365/236; 307/480; 377/76
[58] Field of Search ........................... 307/480; 377/76; 365/233, 219, 221, 236

[56] References Cited

U.S. PATENT DOCUMENTS

| | | | |
|---|---|---|---|
| 3,577,086 | 5/1971 | Kliman et al. | 377/76 |
| 4,287,577 | 9/1981 | Deal | 365/233 |
| 4,823,321 | 4/1989 | Aoyama | 365/221 |

Primary Examiner—Joseph E. Clawson, Jr.
Attorney, Agent, or Firm—Foley & Lardner, Schwartz, Jeffery, Schwaab, Mack, Blumenthal & Evans

[57] ABSTRACT

A line memory for speed conversion, whose data rates of write into and read from a memory cell (1) differ from each other, has a write circuit (2, 3, 4) for writing input data ($D_{in}$) into the cell (1) at a predetermined rate and resetting the write address of the cell (1) at a predetermined period, a read circuit (5, 6, 7) for reading data ($D_{out}$) from cell (1) at a rate different from the write rate and resetting the read address of the cell (1) at the predetermined period, the first shift circuit (8) for shifting reset timing of the write address, and the second shift circuit (9) for shifting reset timing of the read address, the first and second shift circuits enabling respective setting quantities at the same value. This memory can shift both the write address reset timing and the read address reset timing while keeping both in the same condition.

6 Claims, 4 Drawing Sheets

FIG. 1 PRIOR ART
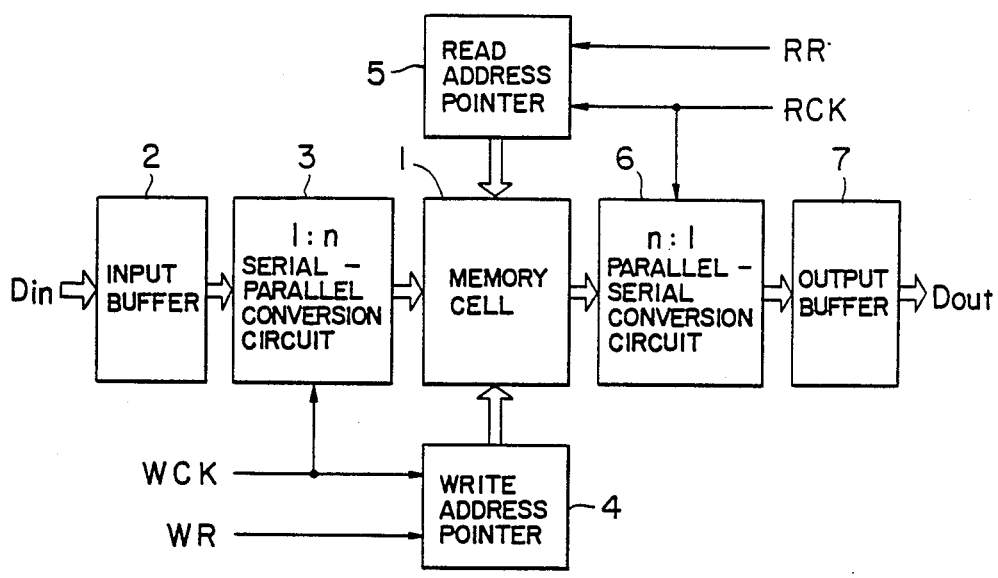
FIG. 2a PRIOR ART
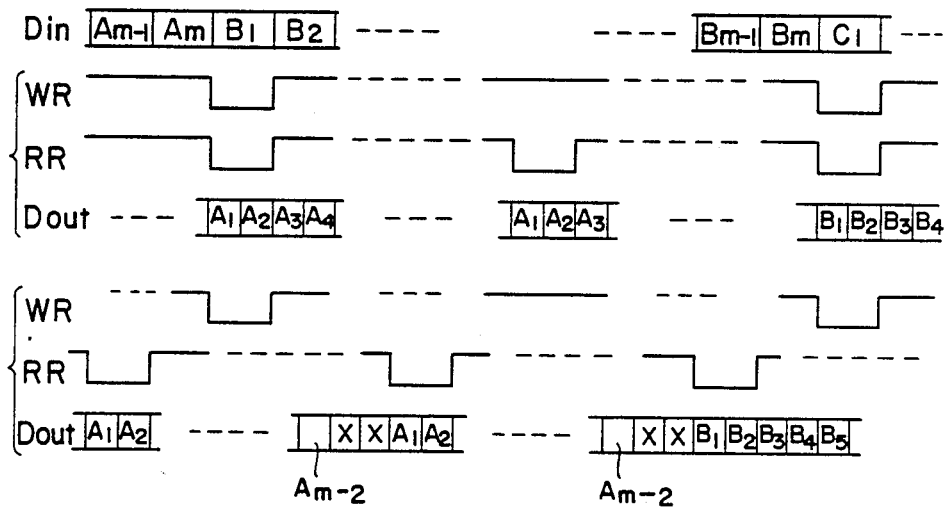
FIG. 2b PRIOR ART FIG. 3
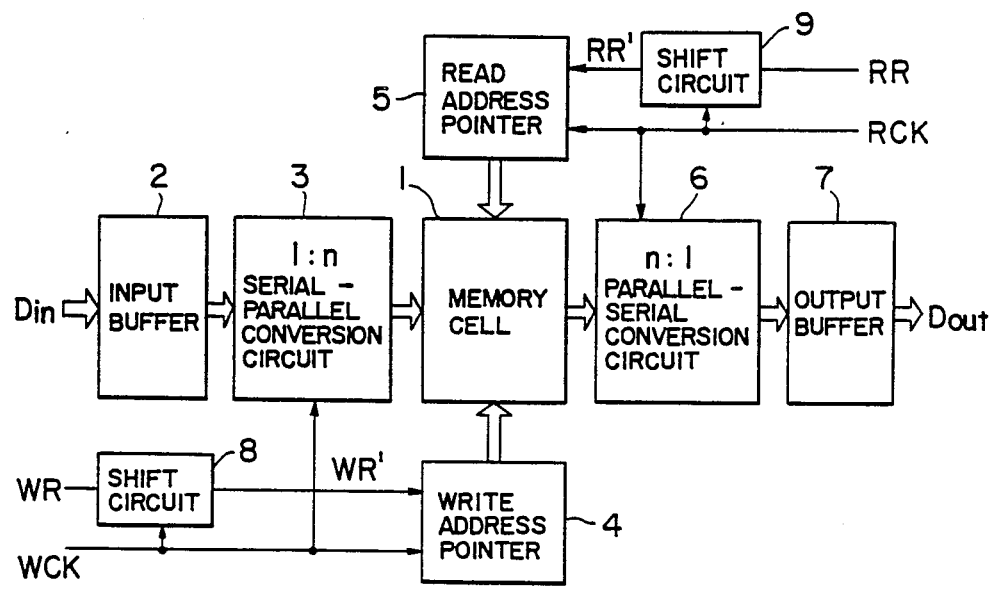
FIG. 4a
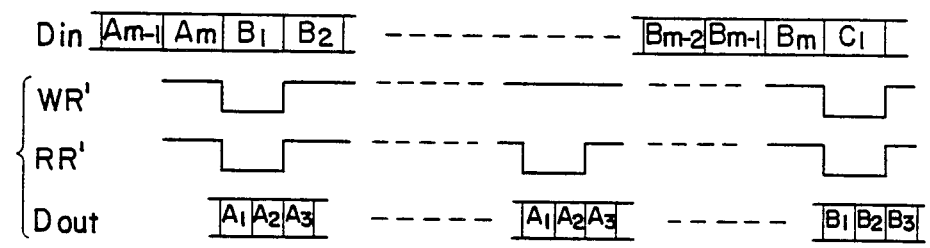
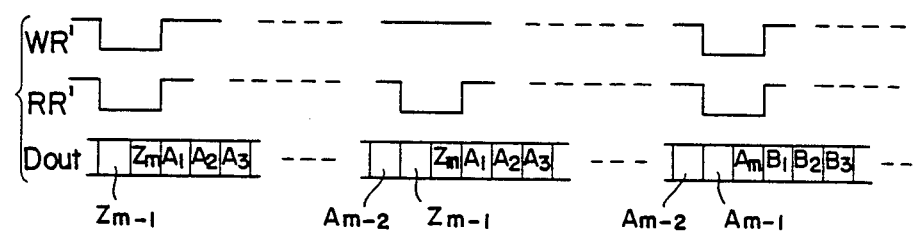
FIG. 4b

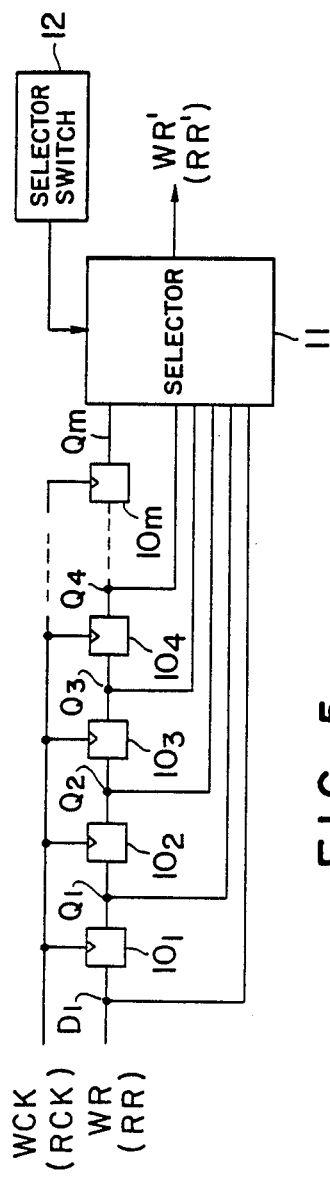
F I G. 5
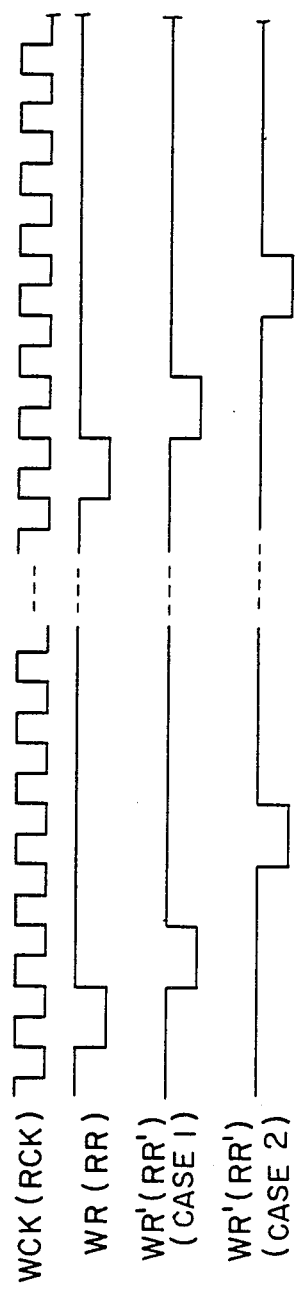
F I G. 6

LINE MEMORY FOR SPEED CONVERSION

BACKGROUND OF THE INVENTION

This invention relates to line memories used in the field of image processing, particularly line memories for speed conversion at different input and output data rates.

FIG. 1 illustrates configuration of conventional line memories for speed conversion and FIG. 2 their time charts in which the exemplified output data rate is as high as twice the input data rate.

In FIG. 1, serially input data $D_{in}$ enters a 1:n (n is an integer) serial-parallel conversion circuit 3 through input buffer 2 in order to reduce the actual operation speed of memory cell 1. The output of conversion circuit 3 whose operation speed has become 1/n is entered in memory cell 1 and is written in a memory region having a write address assigned by write address pointer 4. The write address pointer 4 operates by a write clock WCK and increases the write address at every output timing of conversion circuit 3, resets the write address to "0" by write address reset signal WR entered at every interval of a predetermined number of cycles of write address increase, and starts a new write cycle.

The data written in memory cell 1 is read out in the order of the address assigned by read address pointer 5. Address pointer 5 is operated by a read clock RCK and increases read addresses in cycles shorter by the ratio of input and output data rates than cycles of write address increase, and resets read address to "0" by a read address reset signal RR entered at every interval of a predetermined number of cycles of read address increase, and starts a new read-out cycle.

Memory cell 1 has two memory areas (not illustrated) which contain the same number of memory regions. On this memory cell the write is made alternately in two memory areas and the read-out in the memory area where write is not made. When the ratio of output data $D_{out}$ to input data $D_{in}$ is, for example, two, the read-out speed is therefore twice the write speed. The read-out cycle is therefore repeated twice in one write cycle. In this case, after a write cycle starts at the time when a write address-reset signal WR is entered, the write cycle and two read-out cycles finish at the time when the second read address reset signal RR is entered, and the area to be written and the area to be read out are interchanged.

The data read out from memory cell 1 is entered into a n:1 parallel-serial conversion circuit 6. The output of conversion circuit 6, operation speed of which comes to N times the read-out speed of memory cell 1, is sent out serially as output data $D_{out}$ through output buffer 7.

The above mentioned operation is described in detail with reference to the time chart in FIG. 2. As shown in FIG. 2(a), usually a write reset signal WR and a read reset signal RR are fed simultaneously, and at this point of time input data $D_{in}$ (e.g. $B_1, B_2, \ldots, B_m$) starts to be written in one side area of memory cell 1, while readout of previously written input data (e.g. $A_1, A_2, \ldots, A_m$) from the other side area starts. Since, as mentioned above, the read-out speed is twice the write speed, the read-out cycle of previously written input data $A_1, A_2, \ldots, A_m$ is repeated twice during the write cycle of new input data $B_1, B_2, B_m$. At the input time of second read address reset signal RR after write address reset signal WR, memory areas of write and read-out interchange, read of data $B_1, B_2, \ldots, B_m$ out of the area in Which data is previously written starts, and write of next input data $C_1, C_2, \ldots, C_m$ into the area at which data has been read out previously starts.

FIG. 2(b) is a time chart in which timing of output data $D_{out}$ is shifted from FIG. 2(a). In such a case, input timing of read address reset signal RR is shifted as shown in the time chart. This operation shifts the output data timing by the same quantity of the shift of read address-reset signal RR.

As mentioned above, in conventional technique, when required to shift the timing of output data, read address-reset signal RR is shifted by the same quantity as the above shift. When read address signal RR is shifted in such a way, the time lag between write address reset signal WR and read address reset signal RR occurs as shown in the time chart of FIG. 2(b). For example, read address reset signal RR precedes write address reset signal WR by two-clock input data $D_{in}$ in the time chart of FIG. 2(b). In this case, as described above, since memory areas of write and read interchange at the time of input of the second read address reset signal RR (e.g. read address reset signal RR at the left end of the time chart) after write address reset signal WR, data $A_{m-1}$ and $A_m$ that are written after input time of left-end read address reset signal RR are written in areas which differ from that of data $A_1, A_2, A_{m-2}$ which have been written previously. Consequently, data $A_{m-1}, A_m$ are not read out and different data (data shown with "X" in the time chart) after data $A_1, A_2, \ldots, A_{m-2}$ are read out in read-out cycle which starts with left-end read address reset signal RR. The same as above occurs in all readout cycles. When read address reset signal RR is shifted as above, the time lag occurs between write address-reset signal WR and read address reset signal RR, and it happens as a problem that data written during the period of this time lag disappears from output data.

Furthermore, in order to increase operation speed of line memory, the 1:n serial-parallel conversion is made at write as mentioned above and write in memory cell is made at every n clock input data $D_{in}$. In this case, to prevent interchange of memory areas of write and read during write in a certain address, a time lag between read address reset signal RR and write address reset signal WR should be equal to the increased period of read address or should be an integer multiple of it. Therefore, read address reset signal RR must be shifted in unit of n-clock input data $D_{in}$, and consequently data output timing must be shifted only in unit of n-clock input data $D_{in}$.

SUMMARY OF THE INVENTION

The object of this invention is to provide a line memory for speed conversion that can shift output timing at shorter time units than conventional ones and does not lack in output data.

This invention provides the line memory for speed conversion comprising a memory cell containing plural memory regions having addresses, means for writing input data in each memory region of the memory cell in order of the address at a specified rate and for resetting a write address of the region in a specified period, means for reading out the data from each memory region of the memory cells in order of the address at a rate different from the write rate and for resetting a read address of the region in the above specified period, first shift means for shifting reset timing of the write address, and second shift means for shifting reset timing of the read address, and in which these first and second shift means can set shift quantities to the same value.

According to the above construction, when the reset timing of the read address is shifted in order to shift the data output timing, the reset timing of write address also can be shifted by the same quantity. Consequently, the read- and write-address reset timing can be shifted together in such condition that they coincide with each other. In such shift, the data output timing shifts by the value which is obtained by subtracting the shift quantity from the value of shift quantity multiplied by the ratio of input and output data rates.

Furthermore, the fact that the write address reset timing is equal to the read address reset timing means that the end time of write cycle is equal to the time of memory area interchange. Therefore, the memory areas do not interchange prior to the finish of write cycle, and it does not occur to lack in a part of output read data.

Furthermore, the fact that the write address reset timing coincides with the read address reset timing means that there is not such restriction that the time lag between both kinds of timing should be set to an integer multiple of an increased period of write address. Therefore, shift of the write and read address reset timing can be carried out in units of one clock cycle input data. In this case, as mentioned above, since the shift of data output timing comes to the value which is obtained by subtracting shift quantity from the value obtained by multiplying shift quantity by the ratio of input and output data rates, the shift of data output timing can be carried out in smaller units than prior ones. Particularly, in the case of usual application in which the ratio of input and output data rates is 2, shift can be carried out in units of one clock cycle of output data.

BRIEF DESCRIPTION OF THE DRAWINGS

FIG. 1 is a block diagram illustrating a conventional example of line memory for speed conversion.

FIGS. 2(a) and (b) are time charts illustrating operations of the conventional example in FIG. 1.

FIG. 3 is a block diagram illustrating an embodiment of line memory for speed conversion concerned with this invention.

FIGS. 4(a) and (b) are time charts illustrating the operation of the in FIG. 3.

FIG. 5 is a schematic diagram illustrating an embodiment of the shift circuit.

FIG. 6 is a time chart illustrating operation of the circuit in FIG. 5.

DESCRIPTION OF THE PREFERRED EMBODIMENT

Figure 7:
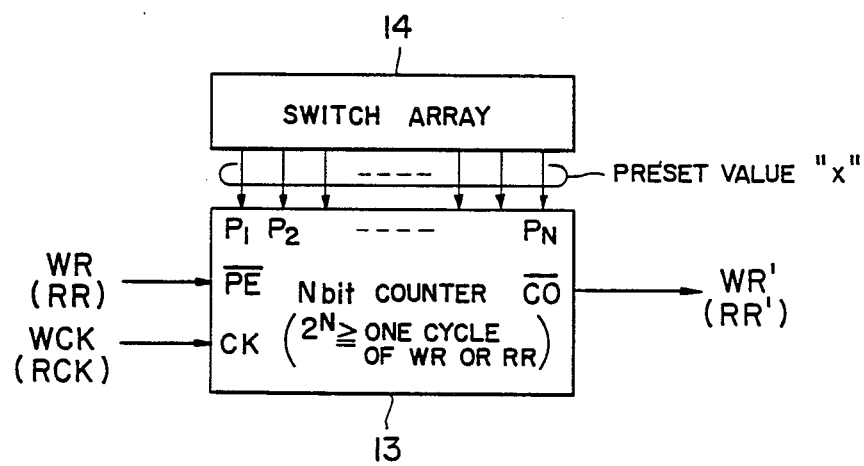
FIG. 7 is a schematic diagram illustrating another embodiment of the shift circuit.

Referring to the embodiment of this invention, FIG. 3 illustrates the configuration of embodiment of the line memory for speed conversion of this invention and FIG. 4 its time chart, in which the output data rate is twice the input data rate.

In FIG. 3, input data $D_{in}$ is entered serially to the 1:n (n is an integer) serial-parallel conversion circuit 3 through input buffer 2. This conversion circuit 3 operates by a write clock WCK with which input data synchronizes, its input operation speed is equal to the rate of input data $D_{in}$ and the output operation speed comes to 1/n of the input operation speed. Thus the output of conversion circuit 3 whose operation speed is 1/n enters memory cell 1 and is written in a memory region having a write address specified by write address pointer 4.

Write address pointer 4 operates by write clock WCK and increases the write address at every output timing of conversion circuit 3. Write address pointer 4 resets the write address to "0" and starts a new write cycle by input of write address reset signal WR' which is generated by shifting the write address reset signal WR by shift circuit 8. The write address reset signal WR is generated at every interval of a specified integer number of write address increase cycles.

The data written in memory cell 1 is read out from a memory region having a read address specified by a read address printer 5. Read address pointer 5 is operated by a read clock RCK with which output data $D_{out}$ synchronizes and increases the read address in a shorter period which is a division of the period of write address increase by the ratio of input and output data rates. Read address pointer 5 resets the read address to "0" and starts a new read cycle by input of a read address reset signal RR' which is generated by shifting the read address-reset signal RR by shift circuit 9. The read address reset signal RR is generated at every interval of a specified integer number of read address increase cycles.

Write clock WCK is applied to shift circuit 8 to determine the variable unit of the shift and the shift is variable in units of one clock cycle of write clock WCK, i.e., one clock cycle of input data $D_{in}$. Furthermore, read clock RCK is applied to shift circuit 9 to determine the variable unit of the shift and the shift is variable in units of one clock cycle of write clock WCK, i.e., one clock cycle of input data $D_{in}$, or a similar effect can be obtained by entering write clock WCK instead of read clock RCK.

FIG. 5 shows an example of circuit configuration of shift circuit 8(9). Shift circuit 8 shown in FIG. 5 is equipped with a shift register composed of serially connected multi-stage flip-flops $10_1$ to $10_m$. Write clock WCK is applied to the clock terminal of each of the flip flops $10_1$ to $10_m$ of this shift register and write address reset signal WR is applied to D input terminal of first flip-flop $10_1$. Therefore, write address reset signal WR is transferred in order to the back stage of shift register every time one clock pulse of write clock WCR is applied. D input terminal $D_1$ of the first-stage flipflop $10_1$ and output terminals $Q_1$ to $Q_m$ of flip-flops $10_1$ to $10_m$ are connected with input terminal of selector 11. Selector 11 selects one of those input signals and outputs it as write address reset signal WR'. This selection is carried out by a code signal from selector switch 12. Selector switch 12, for example, has a group of manual operation switches and outputs a code signal corresponding to their ON/OFF. As to each write address reset signal WR', the case that outputs $Q_1$ of first-stage flip-flop $10_1$ is selected by selector switch 12 and the case that output $Q_3$ of third-stage flip-flop $10_3$ is selected are illustrated as case 1 and case 2, respectively, in FIG. 6.

It is shown in FIG. 6 that write address reset signal WR' can be delayed in units of one clock cycle of write clock WCR. Shift circuit 9 on the output side is also constructed in the same way as above.

The shift quantities of shift circuits 8 and 9 are set by each select switch 12 to be equal mutually. Otherwise shift circuits 8 and 9 may be constituted by common use of the same selector switch 12 so that the shift quantities of both shift circuits can be automatically made identical. As a result of the same shift quantities attained in both shift circuits, the shift quantity of shift circuit 9 becomes variable practically in units of two clock cycles of output data $D_{out}$ because when, for example, the output data rate is twice the input data rate, one clock cycle of input data $D_{in}$ equals two clock cycles of output data $D_{out}$.

Memory cell 1 is the same as conventional one, that is, has two memory areas that have the same number of memory regions and which alternately allow write and read when not in write process. For instance, if the output data rate is twice the input data rate, two read cycles are carried out during one write cycle. At the time of end of the 2 read cycles, read address reset signal RR' interchanges the write and read memory areas.

The data read from memory cell 1 is sent to an n:1 parallel-serial conversion circuit 6. This conversion circuit 6 is operated by a read clock RCK, and its input operation speed is the same as the read speed of memory cell 1, and its output operation speed is n times the input operation speed, i.e., the same as the rate of output data $D_{out}$. The output of the conversion circuit 6 is output as serial output data $D_{out}$ through an output buffer 7.

The operation of such configuration is described hereunder with reference to the time charts of FIGS. 4(a) and 4(b). WR' and RR' in FIG. 4(b) are shifted 2 clock cycles of input data $D_{in}$ from those in FIG. 4(a) by shift circuit 8 and 9.

FIG. 4(a) is the same as FIG. 2(a), already described. For example, once write of data $B_1, B_2, \ldots, B_m$ is started by write address reset signal WR', read of data $A_1, A_2, \ldots, A_m$ which have been already written is started by simultaneously entered read address reset signal RR'. When two cycles of this read is completed, the write cycle is also completed, and subsequently by both reset signals WR' and RR' entered simultaneously the write of next data $C_1, C_2, \ldots, C_m$ and the read of the previously written data $B_1, B_2, \ldots, B_m$ are started. In such a way, the write and read operations continue to repeated.

The time chart of FIG. 4(b) shows the case where read address reset signal RR' is shifted by two clock cycles of input data $D_{in}$, i.e., 4 clock cycles of output data $D_{out}$ from the case of (a) above. In this case of FIG. 4(b), as described above, write address reset signal WR' is also shift by the same quantity as that of read address reset signal RR', thus retaining coincidence of timing of both reset signals WR' and RR'. In this time chart, for instance, when the time of input of a write address reset signal WR' at the left end is given attention, it is realized that the write cycle to be started at this time of input is started at data $A_{m-1}$ which is two data cycles before that of FIG. 4(a). Therefore, in the preceding write cycle, data $Z_{m-1}, Z_m, A_1, A_2, \ldots, A_{m-2}$ which are precedent to data $A_{m-1}$ are to have been written, and in the read cycle started by read address reset signal at the left end, the read is started at Data $Z_{m-1}$. The time of read of this first data $Z_{m-1}$ precedes the time of read of the first data $A_1$ in the case of FIG. 4(a) by a shift quantity of reset signals WR' and RR', i.e., by 4 clock cycles of output data $D_{out}$. Data $A_1$, which is read out two clock cycles after read of data $Z_{m-1}$, therefore, will precede the time of read of Data $A_1$ of FIG. 4(a) by two clock cycles. The same can be applied to all other data. In other words, shifting reset signals WR' and RR' by two clock cycles of input data $D_{in}$ causes a shift quantity of one clock cycle of input data, i.e. two clock cycles of output data, in the data output timing. Generally speaking, the shift quantity in the data output timing will be equal to a value obtained by subtracting the shift quantity of reset signals WR' and RR' from the result of multiplication of the shift quantity by the ratio of output and input data rates (2 in the present case). Because the shift of reset signals WR' and RR' can be made for every clock cycle of input data, a value obtained by subtracting 1 from the above-mentioned ratio of output and input rates, i.e., one clock of output data can be the variable unit of the clock cycle.

The write cycle that is started at data $A_{m-1}$ and initiated by write address reset signal WR' at the left end of the time chart proceeds with the write of data $A_m, B_1, B_2, \ldots$, and ends by write of data $B_{m-2}$. During this time of write cycle the data written in the preceding cycle, $Z_{m-1}, Z_m, A_1, A_2, \ldots, A_{m-2}$, are read two cycles. Upon completion of two read cycles the next write address reset signal WR' and read address reset signal RR' are simultaneously entered, thus starting the next write and read cycles. In such a way input data $D_{in}$ are read and sent out as output data $D_{out}$ in the order of input, thus securing complete output of output data $D_{out}$ without any lack of a part of data.

Furthermore, in addition to the above-mentioned embodiment, in which the output data rate is twice the input data rate, this invention may be applied to the cases where the output data rate exceeds twice the input data rate.

While a preferred embodiment has been described above, this invention is limited thereto but may be otherwise variously embodied within the scope of the invention. For instance, such a circuit as FIG. 7 may be used as shift circuit 8. The shift circuit of FIG. 7 provided with an N-bit binary counter having preset input terminals $P_1$ to $P_N$ and a switch array 14 to give a preset value "x" to the preset input terminals $P_1$ to $P_N$ of counter 13 Whose bit number N is selected so that the numeric value of $2^N$ is more than the number of clock cycles in the period of a write address reset signal.

To clock terminal CK of counter 13 a write clock signal WCK, and to preset enable terminal PE an address reset signal WR are given, respectively. Further, as the shifted write address reset signal WR', output signal of a carry-out terminal $\overline{CO}$ is used.

Figure 8:
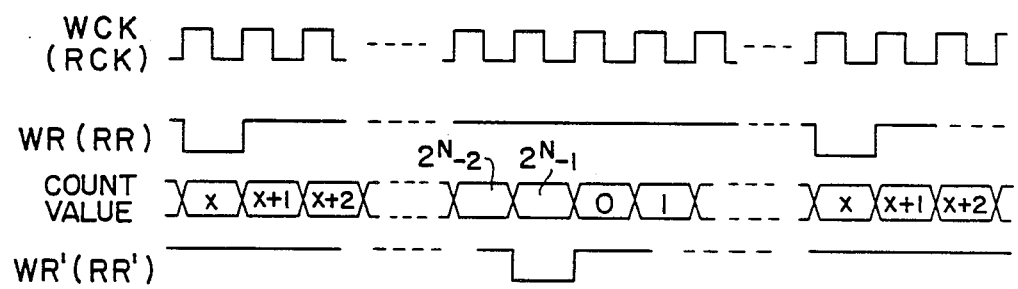
FIG. 8 is a time chart illustrating operation of the circuit in FIG. 7.

Referring to the time chart of FIG. 8, counter 13 presets its count value to the preset value "x" by input of write address reset signal WR (low level). Counter 13 counts up from the above preset value every time when write clock signal WCK is entered in such a way as "x", "x+1", once the counted value reaches "$2^N-1$", the level of carry-out terminal $\overline{CO}$ turns low, i.e., write address reset signal is sent out, thus providing a shift quantity equivalent to the clock count of $(2^N-1)-x$.

The circuit of FIG. 7 may be used in shift circuit 9 on the output side.

What is claimed is:

1. A line memory for speed conversion comprising; a memory cell having a plurality of memory regions having addresses, write means for writing input data into said regions of said memory cell in order of said address at a first rate and resetting a write address of said region in a predetermined period, read means for reading said data out of said regions of said memory cell in order of said address at a second rate different from said first rate and resetting a read address of said region in said predetermined period, first shift means for shifting reset timing of said write address, and second shift means for shifting reset timing of said read address, both of said first and second shift means being able to set shift quantities of said reset timing of said write and read addresses to the same value.

2. A line memory for speed conversion as claimed in claim 1, in wherein said first shift means receives a write address reset signal generated at said predetermined period and write clock signals generated in cycles related to said first rate, thereby delaying said write address reset signal by a selected number of cycles of said write clock signals, said write means has a write address pointer that allocates said write address successively in response to said write clock signals, and resets said write address in response to said write address reset signal delayed by said first shift means, said second shift means receives a read address reset signal generated synchronously with said write address reset signal and read clock signals generated in cycles related to said second rate, thereby delaying said read address reset signal by a selected number of cycles of said read clock signals, and said read means has a read address pointer that allocates said read address successively in response to said read clock signals, and resets said read address in response to said read address reset signal delayed by said second shift means.

3. A line memory for speed conversion as claimed in claim 2, wherein said first shift means comprises a shift register that has a number of stages of which the first stage accepts said write address reset signal and which shifts said write address reset signal to subsequent stages in order in response to said write clock signals, a selector that is connected with all of said stages of said shift register and which selects and outputs signal in any one of said stages, and a selector switch for specifying one of said stages to be selected for said selector.

4. A line memory for speed conversion as claimed in claim 2, wherein said second shift means comprises a shift register that has a number of stages of which the first stage accepts said read address reset signal and which shifts said read address reset signal (RR) to subsequent stages in order in response to said read clock signals, a selector that is connected with all of said stages of said shift register and which selects and outputs signal in any one of said stages, and a selector switch for specifying one of said stages to be selected for said selector.

5. A line memory for speed conversion as claimed in claim 2, wherein said first shift means comprises:

a binary counter of a predetermined number of bits that accepts and counts said write clock signals through incorporated input terminal, presets in response to said write address reset signal a counted number of said write clock signals to a numeric value being applied to incorporated preset terminals, and outputs a carry signal when said counted number reaches a countable last number, and a switch array for sending said numeric value to said preset terminals of said counter, and said carry signal output from said counter is used as a delayed write address reset signal.

6. A line memory for speed conversion as claimed in claim 2, wherein said second shift means comprises:

a binary counter of a predetermined number of bits that accepts and counts said read clock signals through incorporated input terminal, presets in response to said read address reset signal a counted number of said read clock signals to a numeric value being applied to incorporation preset terminals, and outputs a carry signal when said counted number reaches a countable last number, and a switch array for sending said numeric value to said preset terminals of said counter, and said carry signal output from said counter is used as a delayed read address reset signal.

* * * * *